United States Patent
Ando

(10) Patent No.: US 7,640,530 B2
(45) Date of Patent: Dec. 29, 2009

(54) METHOD FOR INSPECTING MASK

(75) Inventor: Akihiko Ando, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1012 days.

(21) Appl. No.: 11/020,281

(22) Filed: Dec. 27, 2004

(65) Prior Publication Data

US 2005/0142455 A1    Jun. 30, 2005

(30) Foreign Application Priority Data

Dec. 26, 2003    (JP) .............................. 2003-432984

(51) Int. Cl.
   *G06F 17/50*    (2006.01)
(52) U.S. Cl. .................. 716/19; 716/4; 716/20; 716/21; 703/14
(58) Field of Classification Search ............ 716/4, 716/19, 20, 21
   See application file for complete search history.

(56) References Cited

U.S. PATENT DOCUMENTS 6,990,225 B2 * 1/2006 Tanaka et al. ............... 382/144

FOREIGN PATENT DOCUMENTS

| JP | 2776416 | 5/1998 |
|---|---|---|
| JP | 2003-215059 | 7/2003 |
| WO | WO 99/14706 | 3/1999 |

* cited by examiner

*Primary Examiner*—Thuan Do
(74) *Attorney, Agent, or Firm*—Young & Thompson

(57) ABSTRACT

A mask inspection system 10 inspects an inspection object pattern while comparing an inspection object data obtained in such a way as to image the inspection object pattern with a reference pattern data. The mask inspection system 10 is provided with an inspection information preparing part 12 producing inspection algorithm and inspection sensitivity to the reference pattern data based on wafer simulation, a converting part 13 generating a reference graphic data with inspection information while adding the inspection information to the reference graphic data, and a defect judging part 16 judges propriety of an inspection object pattern data while comparing reference graphic data with an inspection object data in every pixel based on the inspection information added to the reference graphic data with inspection information.

12 Claims, 13 Drawing Sheets

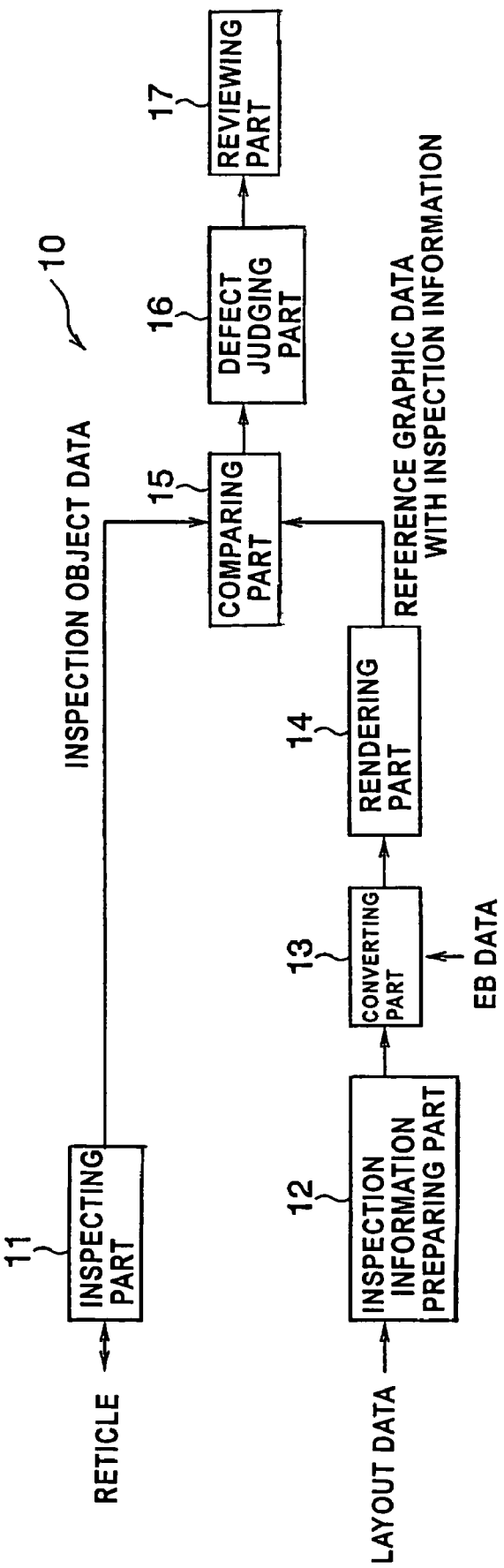

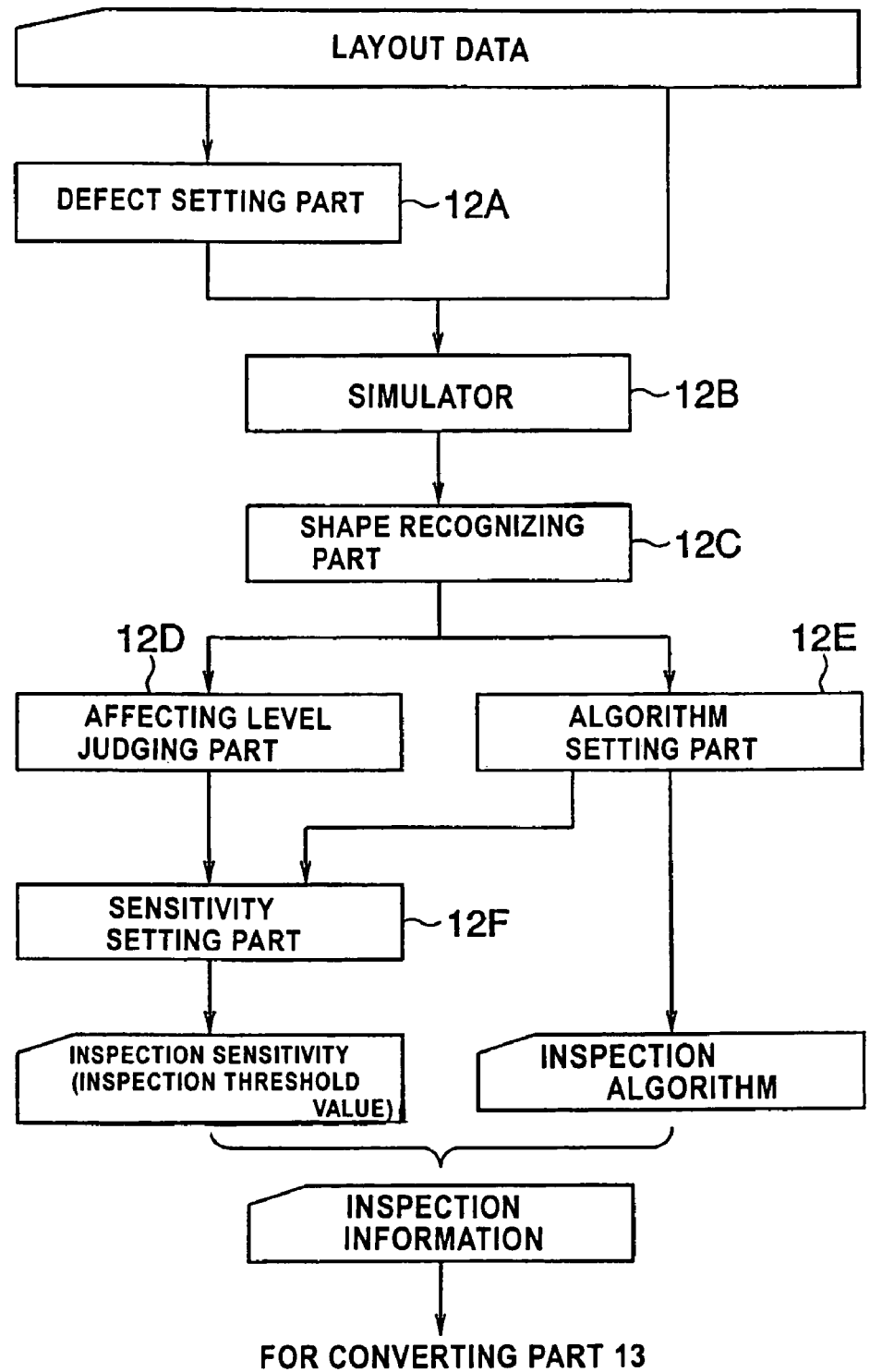

FIG.10A        FIG.10B        FIG.10C        FIG.10D
  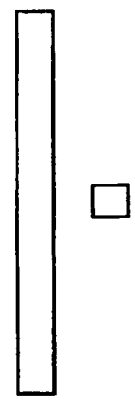 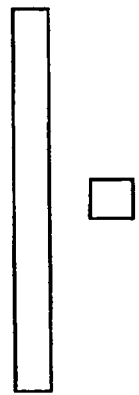
FIG.11A        FIG.11B        FIG.11C        FIG.11D
 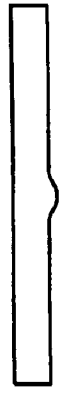  

METHOD FOR INSPECTING MASK

This application is based on Japanese patent application NO. 2003-432984, the content of which is incorporated hereinto by reference.

BACKGROUND OF THE INVENTION

1. Field of the Invention

The present invention relates to a method for inspecting a mask.

2. Description of Related Art

Conventionally, as a method for inspecting a pattern (hereinafter referred to as mask pattern) on a mask or a reticle, adopted method is a method for detecting defects in such a way as to compare an inspection object data obtained by imaging a mask pattern with a design data (EB data) for an electron-beam direct drawing of the mask stored in a CAD.

Here, FIG. 12 shows the conventional and general mask inspection system. The mask inspection system 30 is comprised of an inspecting part 31, a converting part 32, a rendering part 33, a comparing part 34, a defect judging part 35 and a reviewing part 36.

The inspecting part 31 images a mask pattern of an inspection object, and produces the inspection object data of a bitmap form to send to a comparing part 34. The converting part 32 receives the EB data to convert to reference graphic data having the height, the width, and resolution and the like. The converting part 32 sends the converted reference graphic data to a rendering part 33. The rendering part 33 sequentially sends out the reference graphic data to the comparing part 34 while developing the reference graphic data into bit map form data depending on scan condition in the inspecting part 31.

The comparing part 34, as shown in FIG. 13, sequentially compares the inspection object data 37A received from the inspecting part 31 with the bit map data 38A received from the rendering part 38, and sends out the obtained difference value to a defect judging part 35. Within the drawings, reference numeral 37 indicates the mask pattern of the imaged inspection object, and reference numeral 38 indicates the reference graphic data. In the defect judging part 35, a threshold value to be determination reference to detect defect is set previously with respect to each sent difference value. The defect judging part 35 compares the difference value sent out from the comparing part 34 with the threshold value, followed by judging as being defect when the difference value is larger than the threshold value, and stores coordinate information of the defect and image data around the defect. Subsequently, defect judging part 35 send out the coordinate information and the image data of the detected defect about the predetermined inspection area to the reviewing area 36.

The reviewing part 36 displays an image screen on the basis of the coordinate information and the image data of the detected defect received from the defect judging part 35. Performed again is ascertainment with respect to classification of the defect or influence to the semiconductor chip, while referring to this image screen visually.

Meanwhile, even though size of the defect residing in the mask pattern is identical, it is known that there is difference in influence degree of the defect, depending on the position where the defect resides. However, in the conventional method for inspecting the mask using the above described mask inspection system, the whole inspection area of the mask is made to inspect with the same threshold value, therefore, there is a problem that the defect with small influence to the semiconductor chip affected is detected largely, so that it became the cause of lengthened TAT or the like in the semiconductor device.

In order to solve the above-described problem, for instance, in the pattern inspecting device in the Japanese Laid-Open Patent Publication NO. 2003-215059, a plurality of mask patterns are superposed and the area where the high accuracy inspection is required is set as a fine selected area comprising a superimposed area and its vicinity. The defect is judged while using different threshold value between the fine selected area and non-selected area.

Further, in the reticle appearance inspecting device of JP Patent Number 2776416, and the visual inspection and verification system of Japan National Patent Publication NO. 2001-516898, performed is wafer simulation to respective inspection object data and reference graphic data; and with respect to both data, obtained is wafer simulation data, which predicts a pattern transferred to the body to be transferred, on the basis of light intensity distribution, which aims at the body to be transferred of the pattern through the optical system of the stepper. Subsequently, performed operation is the defect detection, upon comparing the inspection object data with the wafer simulation data about the reference graphic data mutually.

SUMMARY OF THE INVENTION

According to the pattern inspecting device of the Japanese Laid-Open Patent Publication NO. 2003-215059, it is possible to elaborately inspect the selected area. The same literature defines that a plurality of mask patterns are superposed and the area where the high accuracy inspection is required is set as a fine selected area comprising a superimposed area and its vicinity. However, we have now discovered that, in the area for which the high accurate inspection is required, the influence degree for the pattern, where the defect is transferred on the body to be transferred, differs depending on the pattern shape such as a thick base, a space, an edge and a corner and the like where the defect resides, even though the size of the defect is identical, or depending on the surrounding pattern and the position relationship where the defect acts.

FIG. 14A shows a mask pattern where the same size and a plurality of defects reside, and FIG. 14B shows a photo resist pattern (PR pattern) on the body to be transferred of the wafer and the like that is transferred using the mask pattern of FIG. 14A. For instance, as shown in FIG. 14A, in the case where there is a defect 25A on a space 22 between the line shaped two mask patterns 18A, 18B, on the occasion when the mask pattern is transferred on the body to be transferred, as shown in FIG. 14B, the bonding 26A between PR patterns is easy to takes place. For this reason, possibility that the defect practically occurs on the body to be transferred is high. On the contrary, as shown in FIG. 14A, in the case where there is the defect 25B at a space 22 in the vicinity of the line shaped one mask pattern 18C, with the same distance from the mask pattern as that of the defect 25A, when being transferred on the body to be transferred, as shown in FIG. 14B, although being accompanied with the shape change 26B of the PR pattern 18C in the vicinity of the defect, as compared with the defect 25A, possibility that the defect practically occurs on the body to be transferred is low.

On the other hand, as shown in FIG. 14A, when mutually comparing the defects 25B to 25D reside in the space 22 in the vicinity of the line shaped one mask pattern 18C, as shown in the marks 26B to 26D in FIG. 14B, on the occasion of being transferred on the body to be transferred, the smaller the distance between the defect and the mask pattern 18C, the larger fluctuation is the edge of the PR pattern 18C, the possibility that the defect practically occurs on the body to be transferred is high.

Further, as shown in FIG. 14A, when the defect 25E resides at the thick base 21 of the mask pattern 18C, and the distance from the defect 25E to the edge of the mask pattern 18C is small, as shown with the mark 26E in FIG. 14B, on the occasion when being transferred on the body to be transferred, the fluctuation of the edge of the PR pattern 18C is easy to occur. On the contrary, as shown in FIG. 14A, when the defect 25F resides on the thick base 21 of the mask pattern 18C, and the distance from the defect 25F to the edge of the mask pattern 18C is relatively large, on the occasion when being transferred to the body to be transferred, as shown with the mark 26F in FIG. 14B, the fluctuation of the edge of the PR pattern 18C is relatively difficult to take place. In the case where the defect resides on the edge 23 or the corner 27, the state on the occasion of being transferred on the body to be transferred is different from the case where the defect resides on the thick base 21 or the space 22.

That is, we have now discovered that, to perform the inspection in which a plurality of mask patterns are superposed and the area where the high accuracy inspection is required is set as a fine selected area comprising a superimposed area and its vicinity is insufficient, in order to certainly detect the defect (true defect) on the mask pattern that causes the defect on the body to be transferred, while suppressing the defect (pseudo defect) on the mask pattern that does not cause the defect on the body to be transferred.

On the contrary, according to the reticle appearance inspecting device of Patent Number 2776416, and the visual inspection and verification system of Japan National Patent Publication NO. 2001-516898, performed operation is comparison, depending on the wafer simulation, while predicting the state where the mask pattern is practically transferred on the body to be transferred, therefore, it is possible to suppress detection of the pseudo defect. However, we have now discovered that it is not easy to perform pattern alignment between the both mask patterns because the mask pattern of the wafer simulation data becomes large in the edge roughness of the pattern in comparison with the mask pattern before transferring. As a result, there has been the fear that the edge roughness itself occurring by the wafer simulation is made to detect as the defect. Further, the wafer simulation data deteriorates in the image accuracy in comparison with data before performing wafer simulation, it is not possible to appropriately compare the both unless accuracy of the wafer simulation is sufficiently enhanced.

That is, we have now discovered that, on the occasion of the inspection of the mask pattern, when detecting the pseudo defect on the mask pattern or roughness or the like produced by the wafer simulation as the defect, time for reviewing the detected pseudo defect or the like becomes a necessity, so that TAT in the inspection of the mask pattern increases.

According to the present invention, there is provided a method for inspecting a mask, which detects defects occurring on a mask pattern prepared based on a layout data, comprising: specifying size of the defect to be detected depending on a state where the defect positions on which pixel of many pixels constituting the mask pattern.

According to the method, it is possible to perform inspection with sufficient inspection accuracy necessary for each pixel constituting a mask pattern. Consequently, it is possible to suppress detection of pseudo defects, and it is possible to certainly detect real defects. For this reason, time elapsed by reviewing many pseudo defects or the like is reduced, so that it is possible to perform speedy pattern inspection.

According to the present invention, there is provided a method for inspecting a mask, comprising: converting a first layout data with no defect pattern data into a first virtual photo resist pattern (PR pattern) data as being a first step, converting a second layout data to which a defect pattern data is added into a second virtual PR pattern data on a wafer as being a second step, detecting a difference data between a first virtual PR pattern data and the second virtual PR pattern data as being a third step, judging whether or not a defect of the defect pattern data is a defect, which is the allowable defect on the wafer based on the difference data as being a fourth step; and extracting a defect, which is not allowable defect on the wafer, as a real defect of the inspection object mask pattern, after eliminating a defect, which is allowable defect on the wafer, as a pseudo defect, based on judgment result at the fourth step, while verifying a real pattern data obtained from an inspection object mask pattern and the first layout data.

According to the method, on the basis of judging result at the fourth step, it is possible to perform inspection with appropriate inspection accuracy depending on influence degree for a pattern to be transferred on a wafer of the defect. Consequently, it is possible to suppress detection of pseudo defects, and it is possible to certainly detect real defects. For this reason, time elapsed by reviewing many pseudo defects or the like is reduced, so that it is possible to perform speedy pattern inspection.

BRIEF DESCRIPTION OF THE DRAWINGS

The above and other objects, advantages and features of the present invention will be more apparent from the following description taken in conjunction with the accompanying drawings, in which:

FIG. 1 is a block graphic showing a configuration of a mask inspection system according to a first embodiment;

FIG. 2 is a block graphic showing a configuration of an inspection information preparing part of FIG. 1;

FIG. 3A shows a mask pattern, FIG. 3B shows a mask pattern of layout data corresponding to the mask pattern of FIG. 3A, and FIG. 3C shows the mask pattern of the layout data with the defect in which the defect is made to set to the layout data of FIG. 3A;

FIG. 4A shows the mask pattern of reference wafer simulation data corresponding to the mask pattern of FIG. 3B, FIG. 4B shows the mask pattern of the wafer simulation data with the defect corresponding to the mask pattern of FIG. 3C, and FIG. 4C shows difference pattern of the mask pattern of FIG. 4A and the mask pattern of FIG. 4B;

FIG. 7B is a view showing an enlarged part of FIG. 7A;

FIGS. 10A to 10D are plan views showing the mask pattern having the defect of predetermined size each;

FIGS. 11A to 11D are plan views showing mask patterns transferred on the body to be transferred using the mask patterns shown in FIGS. 10A to 10D respectively;

DETAILED DESCRIPTION OF THE PREFERRED EMBODIMENT

Figure 3C:
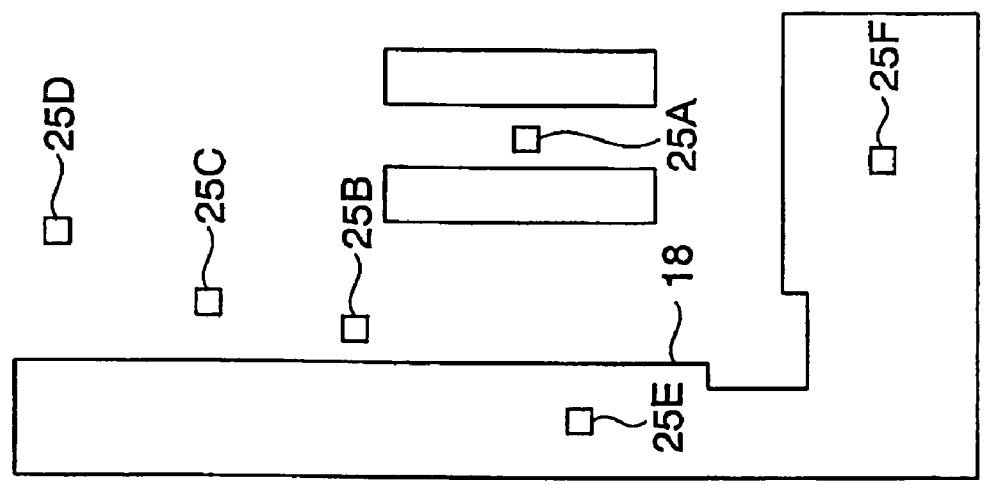
FIGS. 3A to 3C are plan views.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

In the present invention, preferably, the size of pixel is not more than 100 nm×100 nm. In the present invention, preferably, the difference data is a difference data between the first virtual PR pattern data in every pixel and the second virtual PR pattern data. In the present invention, preferably, in the second step, the size of the defect in the defect pattern data is fixed to the predetermined size. In the present invention, preferably, in the fifth step, the larger pixel of the difference data, the smaller threshold value is set; and when the difference data between the real pattern data and the first layout data is larger than the threshold value, it is judged as the real defect.

In the present invention, preferably, in the second step, making the size of the defect in the defect pattern data variable, the minimum size of the defect, which should be extracted as the real defect in the fifth step, is made to obtain. In the present invention, preferably, at the fourth step, when being judged as the allowable defect on the wafer, the step is returned to the second step while increasing the size of the defect in the defect pattern data, on the contrary, at the fourth step, when being judged as the non-allowable defect on the wafer, the step proceeds to the fifth step. Further, in the present invention, preferably, in the fifth step, when being judged as the non-allowable defect on the wafer at the fourth step, established is a threshold value to judge as the real defect that should be compared to the difference data between the real pattern data and the first layout data.

In the present invention, preferably, the threshold value is made to set to five-stage in every pixel.

In the present invention, preferably, in the fourth step, the judgment whether or not the defect is allowable on the wafer is carried out with the judgment algorithm, which depends on the pattern shape to which the defect of the defect pattern data acts. In the present invention, preferably, in the fourth step, the judgment whether or not the defect is allowable on the wafer is carried out with the judgment algorithm, which depends on an edge, a corner, a thick base and a space.

In the present invention, further preferably, in the fourth step, judgment of the defect acting to a thick base and a space is performed by condition whether or not the difference data of the pixel in the position of the defect is substantially zero; and judgment of the defect acting to an edge and a corner is performed by condition whether or not the difference data of the pixel in the position of the defect is predetermined value which is larger than zero. In the present invention, further preferably, in the fourth step, judgment of the defect acting to an edge and a corner is performed by condition whether or not deviations of the pattern layout that the difference data shows is within 7%.

Hereinafter, there will be specifically described an embodiment of the present invention in detail while designating embodiment example with reference to accompanying drawings. FIG. 1 is a block graphic showing constitution of a mask inspection system according to the first embodiment example of the present invention. The mask inspection system 10 is provided with an inspecting part 11, an inspecting information preparing part 12, a converting part 13, a rendering part 14, a comparing part 15, a defect judging part 16 and a reviewing part 17.

Figure 3B:
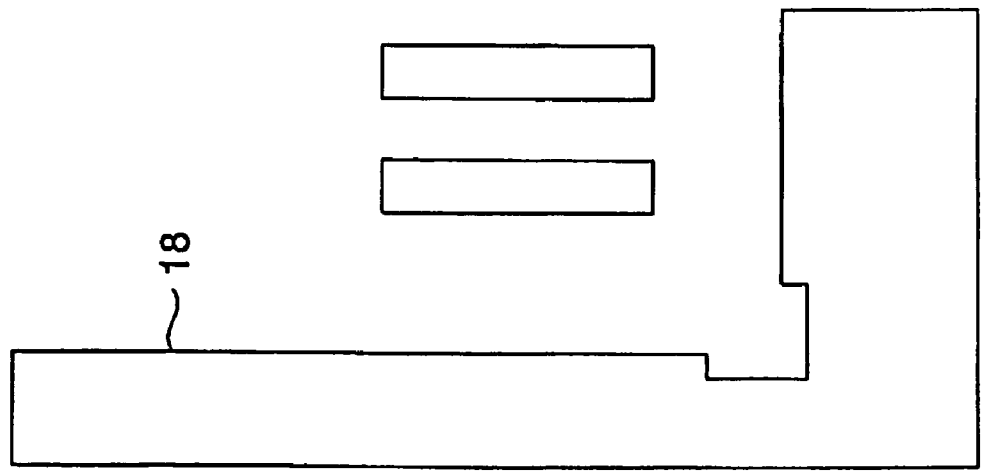
Figure 3A:
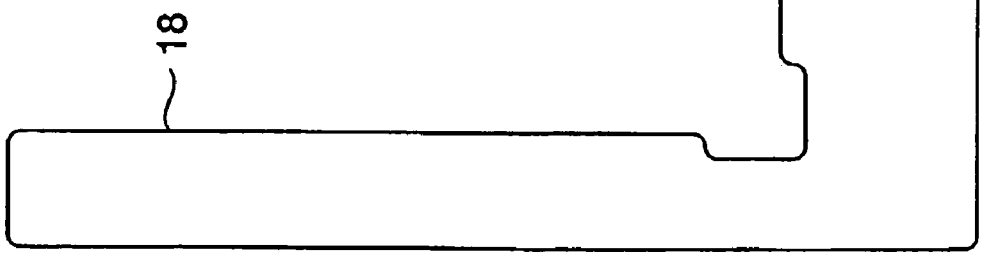

The inspecting part 11 images a mask pattern to be an inspection object pattern shown in FIG. 3A, generates an inspection object data (real pattern data) of a bit map form, and sends out it for the comparing part 15. The inspection object data is pixel data digitized into 0 to 255-gradation from deeper side, corresponding to the light and shade of the imaged mask pattern. A pixel size of the pixel data is pixel units and data units to sequentially compare individual inspection object data with corresponding reference graphic data in the inspecting device of the comparing part 15, thus, generally, it is rectangle of 100 nm×100 nm.

The inspection information preparing part 12 has a function for generating inspection information including inspection algorithm used for the inspection and inspection threshold value for pass/fail judgment. FIG. 2 is a block graphic showing constitution of the inspection information preparing part 12. The inspection information preparing part 12 is provided with a defect setting part 12A, wafer simulating part (simulator) 12B, a shape recognizing part 12C, an affecting level judging part 12D, an algorithm setting part 12E, and a sensitivity setting part 12F.

The defect setting part 12A has a function for forming a layout data with defect (second layout data) shown in FIG. 3C upon setting the defect with predetermined size to arbitrary position corresponding to each graphic pattern, to the received design data shown in FIG. 3B, that is, the mask pattern of the layout data (first layout data).

The wafer simulating part 12B is capable of being obtained a resist pattern formed on the photo resist by the simulation, on the occasion of exposing the photo resist using the mask pattern.

Figure 4A:
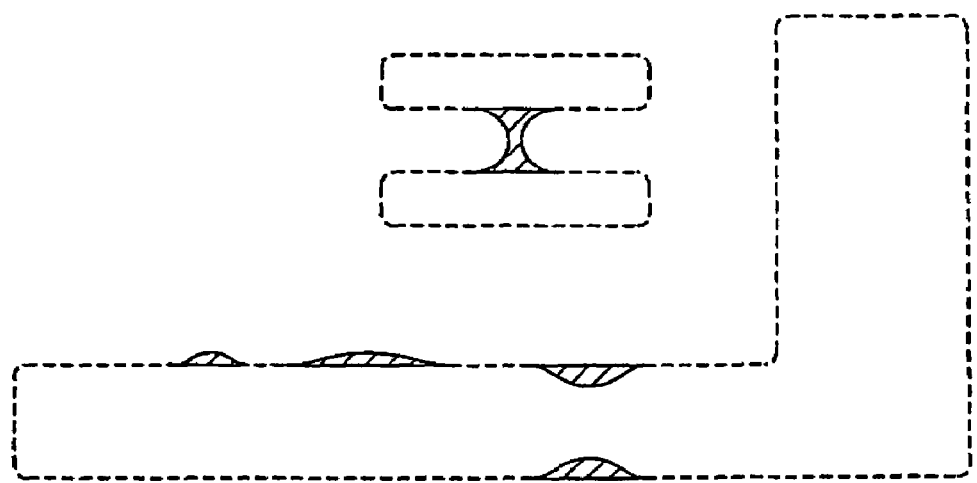
FIGS. 4A to 4C are plan views.

The wafer simulating part 12B previously inputs therein, as an optical system parameter of a stepper, the magnification, numerical aperture of the lens NA, the coherency a of the inspection light and the wavelength X of the inspection light or the like. The wafer simulating part 12B, by using these optical system parameters, respectively creates reference wafer simulation data (first virtual PR pattern data) shown in FIG. 4A, or wafer simulation data with defect (second virtual PR pattern data) shown in FIG. 4B, upon performing wafer simulation to the mask pattern of the layout data and the layout data with defect formed in the defect setting part 12A. The wafer simulation is capable of being performed while using, for instance, the soft wear such as "PROLITH" (produced by KLA-Tencor Company) or "Virtual Stepper" (produced by Synopsys Company).

Figure 5:
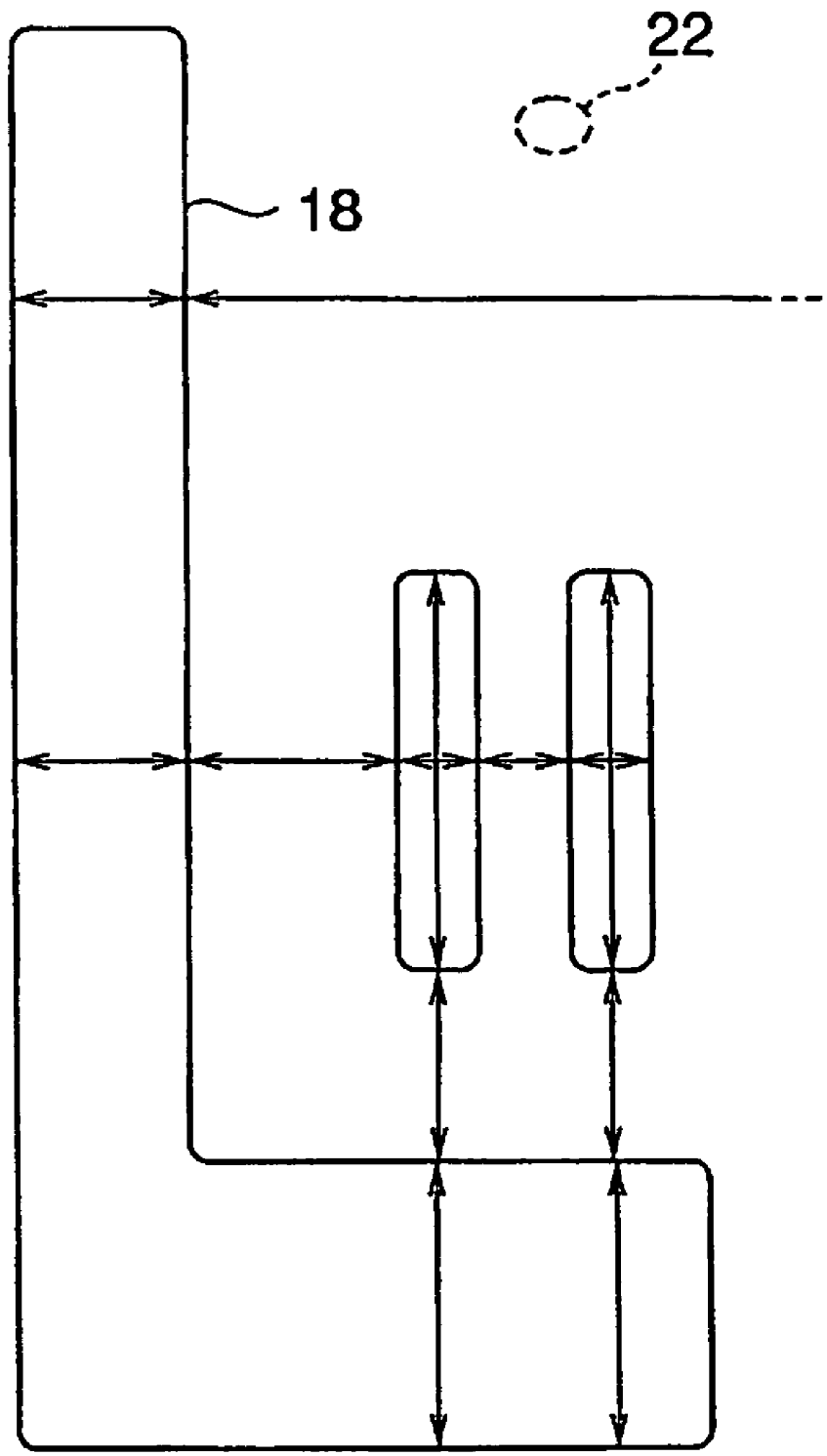
FIG. 5 is a view showing characteristic extraction in a shape recognizing part in FIG. 2.

The shape recognizing part 12C has pattern shape recognition function, and automatically detects dimension of each part of the mask pattern such as the wafer simulation data or the like, thus it is possible to perform its feature extraction. Here, the dimension is, for instance, CD (Critical Dimension) of the mask. For instance, as shown in FIG. 5, with respect to the mask pattern of the reference wafer simulation data or the wafer simulation data with defect, it is possible to detect the width of the mask pattern 18 or the width of the space 22 or the like, as linear distance between the edges, by using direction such as 0, 30°, 45°, 60° and 90° or the like. The pattern shape recognition is also capable of being performed by using predetermined soft wear.

The shape recognizing part 12C performs feature extraction to the reference wafer simulation data and the wafer simulation data with defect formed on the wafer simulating part 12B to detect dimension in the vicinity of respective parts of the mask pattern or the defect set position. The shape recognizing part 12C is also capable of discriminating the pattern shape in each pixel of the mask pattern by the pattern shape recognition function.

The affecting level judging part 12D judges the affecting level in each pixel based on the pattern shape of the mask pattern of the wafer simulation data with defect obtained at the shape recognizing part 12C and the dimension in the vicinity of the defect set position. For instance, the affecting level judging part 12D judges that the level changes how many stages to, for instance, the gradation data classified into 0 to 255.

The algorithm setting part 12E respectively selects the inspection algorithm applied to defect detection in each pixel, in accordance with the pattern shape corresponding to each pixel obtained in the shape recognizing part 12C. In the present embodiment example, selected algorithm is the inspection algorithm for a thick base, the inspection algorithm for a space, the inspection algorithm for an edge, and the inspection algorithm for a corner each corresponding to a thick base, a space, an edge and a corner.

The sensitivity setting part 12F sets the inspection sensitivity applied on the occasion of performing of the defect judgment. That is, setting matter is the inspection sensitivity, namely, the inspection threshold value, which is applied on the occasion of performing of the defect judgment while using the selected inspection algorithm, in every pixel, on the basis of the affecting level judged in the affecting level judging part 12D and the inspection algorithm selected in the algorithm setting part 12E. The inspection algorithm and the inspection sensitivity constitute the inspection information.

Figure 6:
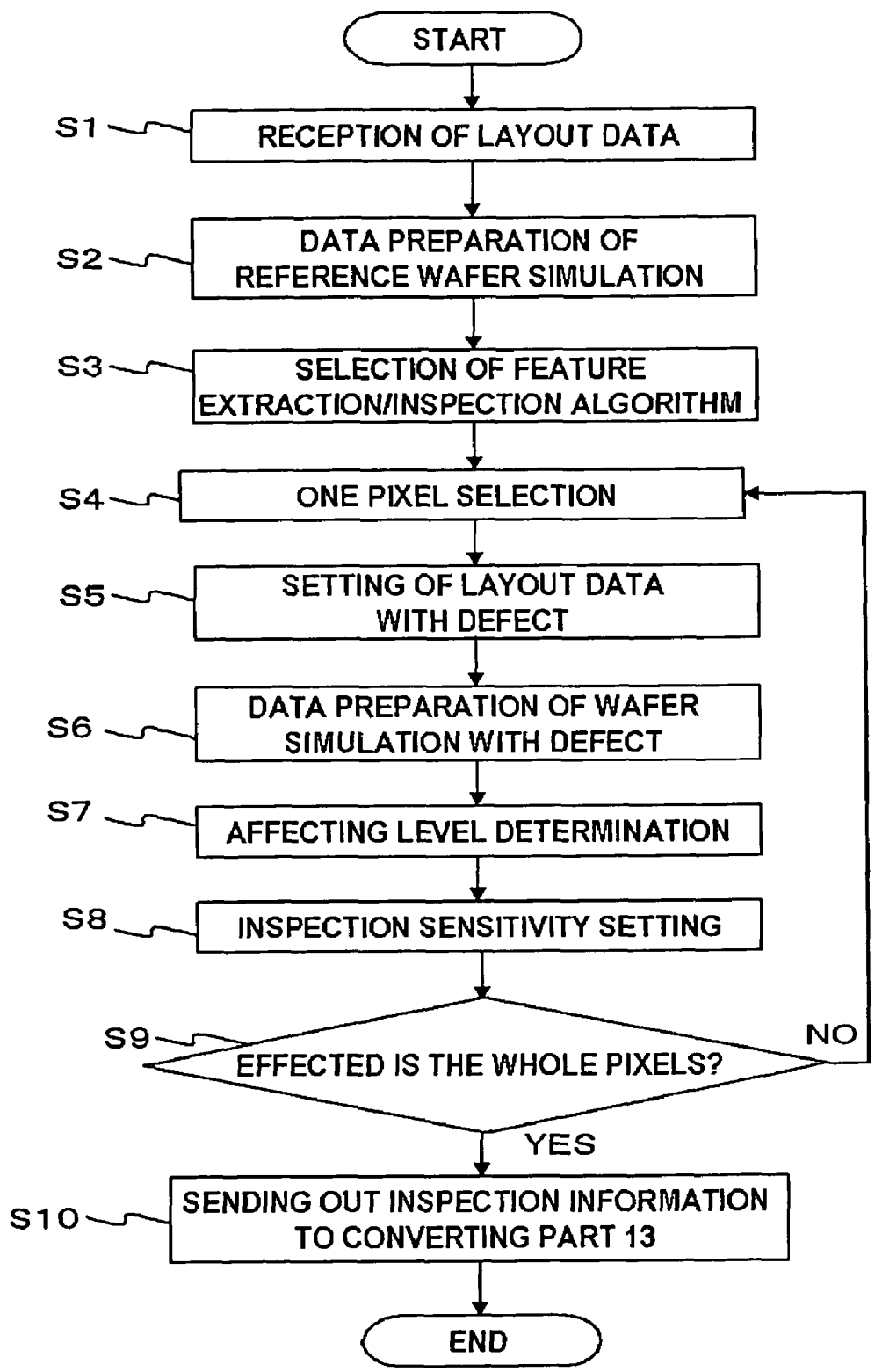
FIG. 6 is a flow chart showing an inspection information formation processing in an inspection information preparing part.

FIG. 6 is a flow chart showing the inspection information preparation processing in the inspection information preparing part 12. First, the inspection information preparing part 12 receives the layout data shown in FIG. 3B (Step S1). Next, the wafer simulating part 12B performs the wafer simulation to the mask pattern of the received layout data, and prepares the reference wafer simulation data shown in FIG. 4A (Step S2). Successively, the shape recognizing part 12C previously performs feature extraction to the reference wafer simulation data, and detects dimension of each part of the mask pattern of the reference wafer simulation data. Further, the shape recognizing part 12C discriminates that each pixel of the reference wafer simulation data corresponds to which pattern shape, the algorithm setting part 12E selects the inspection algorithm corresponding to each pattern shape (Step S3). It should be noted that the inspection algorithm also can be set directly from the layout data or the EB data.

Next, the defect setting part 12A selects a position corresponding to one pixel in the mask pattern of the received EB data as the defect setting position (Step S4). Next, the defect setting part 12A prepares a layout data with defect shown in FIG. 3C upon setting the defect to the mask pattern of the layout data (Step S5). Here, isolate defect such as square dot or pinhole or the like is set to a thick base or a space, while an edge defect formed from concave part or convex part of square is set to an edge. The defect size is fixed to, for instance, 50 nm×50 nm, and setting is performed in such a way that the center of the defect corresponds to center coordinate of the pixel.

Figure 4B:
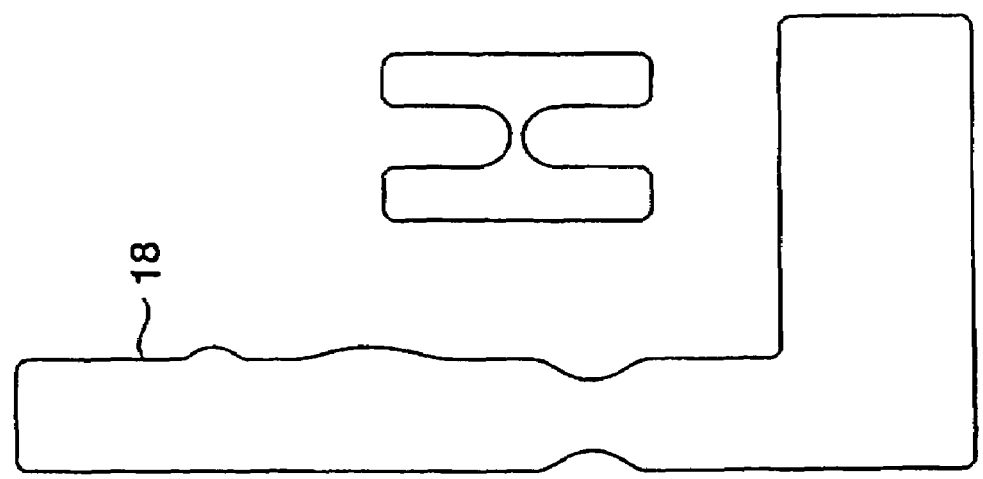

Next, the wafer simulating part 12B performs wafer simulation to the mask pattern of the layout data with defect, and prepares the wafer simulation data with defect shown in FIG. 4B (Step S6). It should be noted that although a plurality of defects are shown in FIG. 3C and FIG. 4B, in the present embodiment example, set is the defect on the position corresponding to one-pixel of the mask pattern of FIG. 3C, per one flow of Step S4 to S9.

Figure 4C:
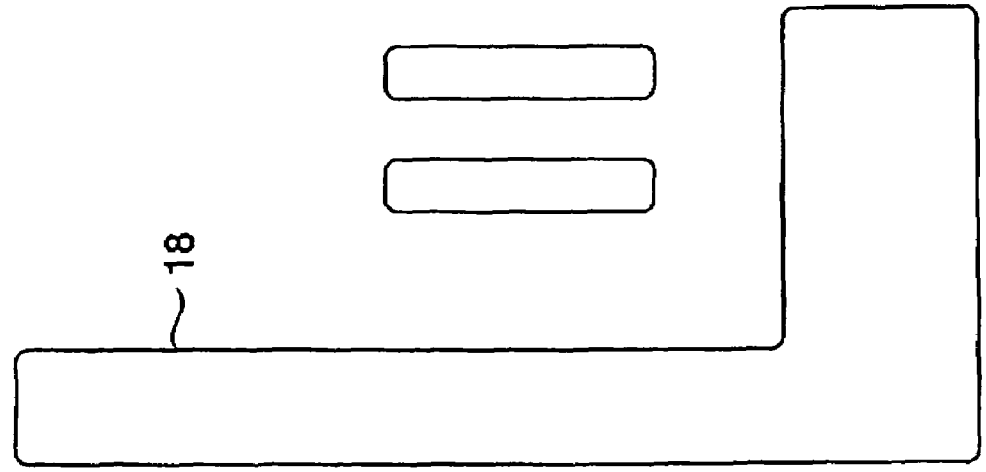

Next, the affecting level judging part 12D calculates difference value of the dimension in the vicinity of the defect setting position of the mask pattern between the wafer simulation data with defect and the reference wafer simulation data. FIG. 4C shows the difference pattern of the mask pattern between the wafer simulation data with defect shown in FIG. 4B and the reference wafer simulation data shown in FIG. 4A. Next, the affecting level is set into five-stage of highest, high, medium, low and lowest depending on magnitude of the calculated difference value (Step S7). In this case, the larger the difference value, the larger the affecting level is set. For instance, in FIG. 3C, "highest" is set to the pixel of defect 25A, "high" is set to the pixel of defect 25B, "medium" is set to the pixel of defect 25C, "lowest" is set to the pixel of defect 25D, "high" is set to the pixel of defect 25E, and "low" is set to the pixel of defect 25F respectively.

Successively, performed judgment is a judgment whether or not the flow of Step S4 to Step S9 is carried out with respect to the whole pixels, and in the case of no, returning to Step S4, defect is set to the pixel to which the defect is not set yet. In the case where setting is performed about the whole pixels, the inspection information preparing part 12 sends out the inspection algorithm about the whole pixels and the threshold values as the inspection information to the converting part 13 (Step S10), the flow ends.

Returning to FIG. 1, the converting part 13 receives the EB data and the inspection information from the inspection information preparing part 12, and, first, converts the EB data to the reference graphic data having the same data form of the inspection object data with the height, the width and the resolution and the like. Next, prepared graphic data is a reference graphic data with inspection information while adding the inspection information to each pixel, which constitutes the reference graphic data.

Figure 7A:
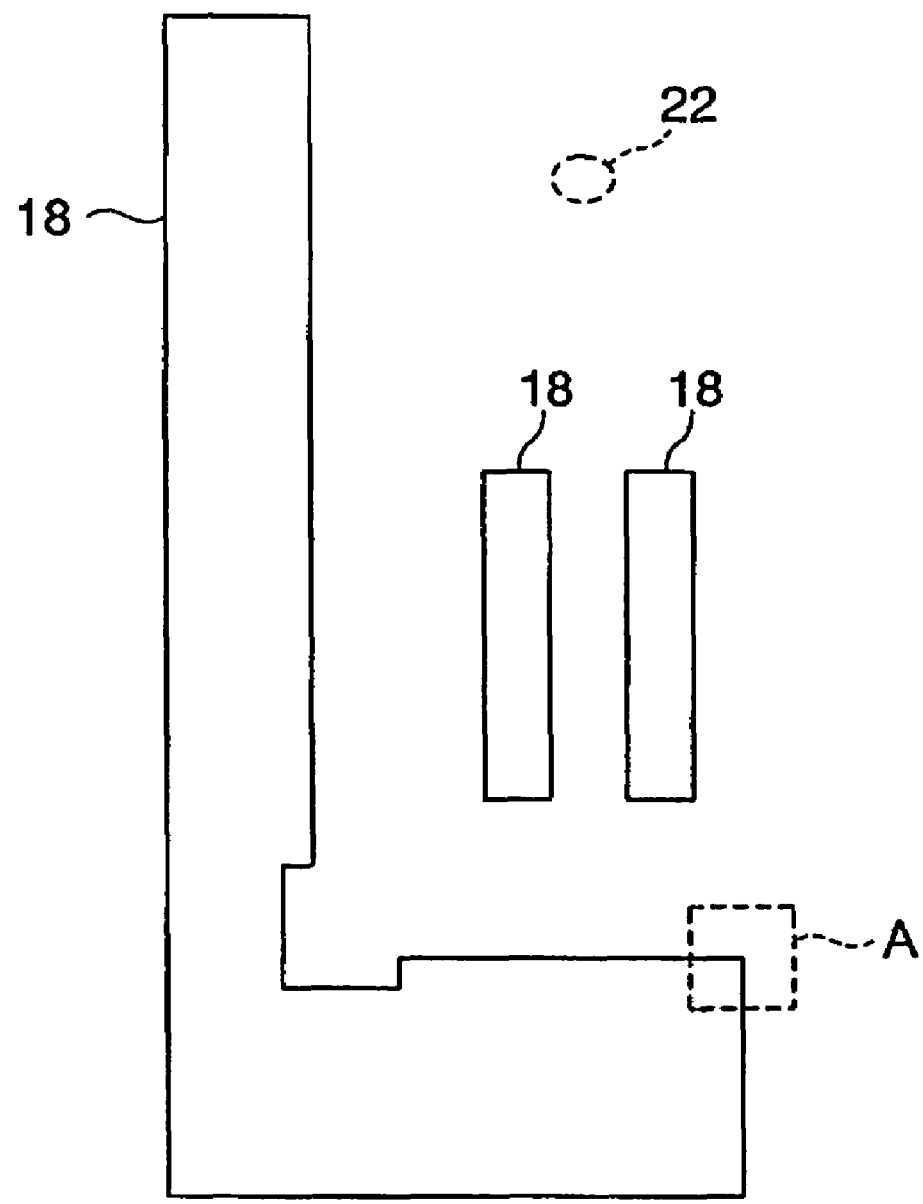
FIG. 7A is a view showing graphic data included in the reference graphic data with inspection information.

FIG. 7A shows the mask pattern of the graphic data included in the reference graphic data with inspection information, and FIG. 7B shows enlarged region A of FIG. 7A. In the reference graphic data shown in FIG. 7B, for instance the pixel 20A constituting the mask pattern 18 has numerical value near 0, the pixel 20B constituting the space 22 has numerical value near 255, and the pixel 20C residing on the boundary between the mask pattern 18 and the space 22 has numerical value in the vicinity of average value between 0 and 255. Each pixel includes the inspection information.

The inspection object data and the reference graphic data are comprised of data having capacity of 8 bits in every pixel, in the case where each data is set to 0 to 255 gradations. In this case, the reference graphic data with inspection information may be constituted from 8-bit graphic data and the inspection information data of the predetermined number of bit in every pixel, or also it may be possible that part of capacity of 8 bits is made, for instance, 0 to 63 gradation data, and remaining is made inspection information data in every pixel.

The rendering part 14 maintains the reference graphic data with the inspection information received from the converting part 13; and sequentially sends the reference graphic data with the inspection information of inspected position while developing the reference graphic data into data of bit map form, depending on scan condition in the inspecting part 11.

The comparing part 15 sequentially receives the inspection object data from the inspecting part 11, and the reference graphic data with the inspection information from the rendering part 14. Next, the comparing part 15 reads out the inspection algorithm included in the reference graphic data with inspection information, and calculates compared value between the inspection object data and the reference graphic data in accordance with the inspection algorithm. The compared value is a difference value between the inspection object data and the reference graphic data, a position error of the mask pattern, and differential values of these values. The comparing part 15 sends out the calculated compared value, and the inspection information included in the reference graphic data with inspection information to the defect judging part 16.

The defect judging part 16 receives the compared value and the inspection information from the comparing part 15. Subsequently, the defect judging part 16, likewise, compares the compared value with the inspection threshold value included in the inspection information, while using the inspection algorithm included in the inspection information; and in the case where the compared value is larger than the inspection threshold value, being judged as the defect, the defect judging part 16 stores the coordinate information of the defect and an image data in the vicinity of the defect. Next, the defect judging part 16 sends out the coordinate information and the image data of the detected defect to the reviewing part 17.

Figure 8A:
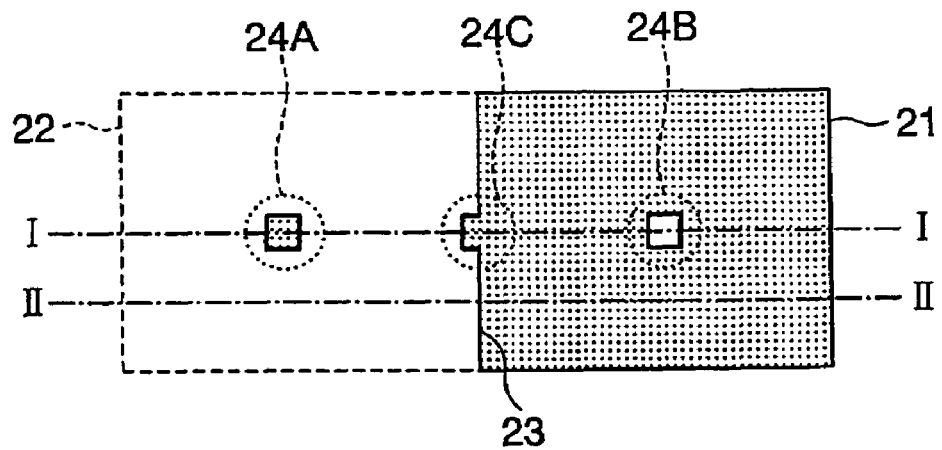
FIG. 8A is a plan view showing a mask pattern having the defect.
Figure 8B:
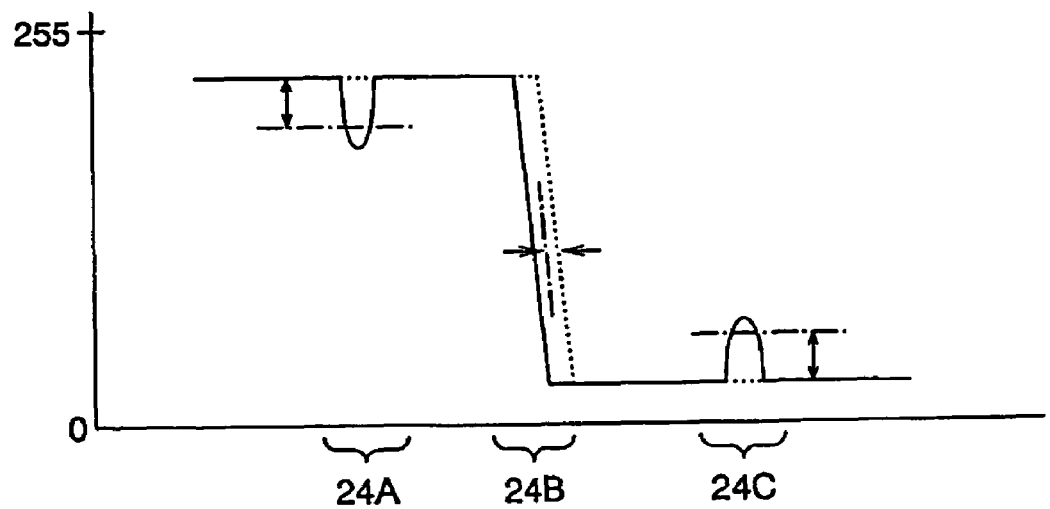
FIG. 8B is a graph showing inspection object data along the line I-I and along the line II-II of FIG. 8A.

FIG. 8A shows the mask patterns where each defect resides in a thick base, a space and an edge, and FIG. 8B shows the inspection object data along I-I line and II-II line of FIG. 8A. As shown in FIG. 8A, assumed member is a mask pattern on which a pinhole defect 24B resides at the thick base 21, a dot defect 24A resides at the space 22, and an edge defect 24C resides in the vicinity of the edge 23.

In FIG. 8B, a solid line indicates the inspection object data along FIG. 8A I-I line, and a dotted line indicates the inspection object data along FIG. 8A II-II line. Level decrease of the pixel data takes place in the vicinity of the pinhole defect 24B, level increase of the pixel data takes place at the dot defect 24A, and lateral direction shift of the pixel takes place at the edge defect 24C. Here, in the case where the pattern shape in inspection is the space 22 or the thick base 21, the inspection algorithm in the pixel is set to the inspection algorithm for the thick base or the inspection algorithm for the space; and the comparing part 15 detects difference between the inspection object data and the reference graphic data, and makes it a compared value.

In the case where the pattern shape in inspection is the edge 23, and a scan detection is made to perform in the direction of I-I line, the inspection algorithm in the pixel is set to the inspection algorithm for the edge, detected is the position error of the mask pattern of the inspection object data and the reference graphic data, that is, width of lateral direction in the same drawing, making it the compared value. In the case where the pattern shape of the pixel is the edge, as the compared value, further, it is also possible to adopt the difference value between differential value of the inspection object data and the differential value of the reference graphic data. The difference value between the differential values is practically taken into consideration with respective directions of XY direction and ±45 degree. It is possible to set various inspection algorithm, which are made to correspond to various pattern shapes other than the above-described inspection algorithm.

The reviewing part 17 displays an image screen on the basis of the coordinate information of the detected defect and the image data received from the defect judging part 16. Performed again is ascertainment about classification of the defect and influence for the semiconductor chip while referring to the image screen by the visual observation.

According to the method for inspecting the mask of the present embodiment example, about each pixel, the inspection algorithm corresponding to the pattern shape of the above described pattern to be transferred is selected, upon using the mask pattern of the reference wafer simulation data, which is the pattern to be transferred of the inspection object pattern, therefore, it is possible to select appropriate inspection algorithm. Further, it is possible to reduce the time necessary for the judgment upon reducing the inspection algorithm used for the judgment.

Further, setting matter is the inspection sensitivity depending on the affecting level in which the defect on the mask pattern of the inspection object pattern is transferred on the body to be transferred, therefore, it is possible to suppress detection of the pseudo defect, and it is possible to certainly detect the real defect. For this reason, it is possible to perform speedy pattern inspection, in that elapsed time by reviewing many pseudo defects or the like is reduced.

Further, according to the method for inspecting the mask of the present embodiment example, different from the invention according to the U.S. Pat. No. 2,776,416 or the Japan National Patent Publication No. 2001-516898, performed simulation is the wafer simulation in order to set the inspection sensitivity to the layout data, therefore, it is possible to perform the wafer simulation without requiring high accuracy. Further, before performing wafer simulation, performed operation is comparison of the mask pattern of the inspection object data with high image accuracy, therefore, both are subjected to alignment in high accuracy and both are capable of being accurately compared with each other.

Figure 9:
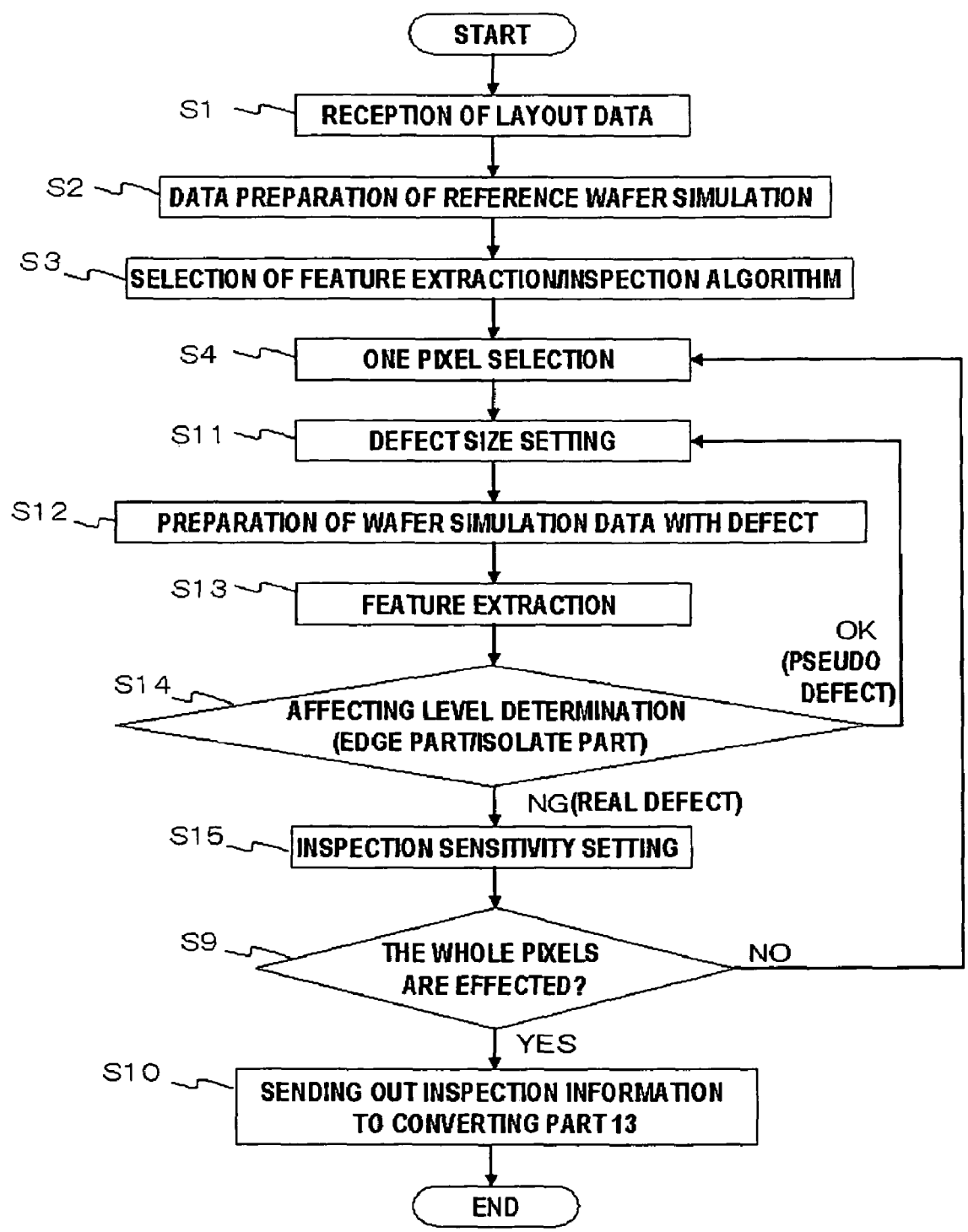
FIG. 9 is a flow chart showing an inspection information formation processing in an inspection information preparing part of a mask inspection system according to a second embodiment.
Figure 12:
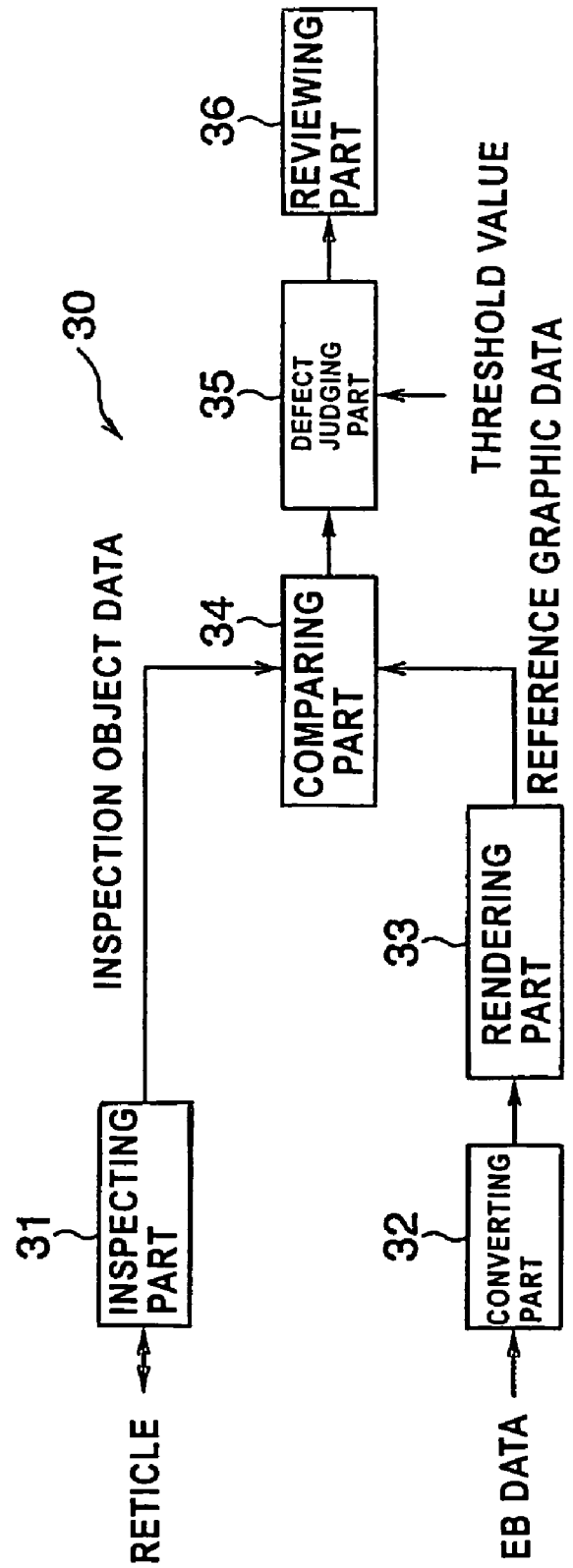
FIG. 12 is a block graphic showing constitution of the conventional mask inspection system.
Figure 13:
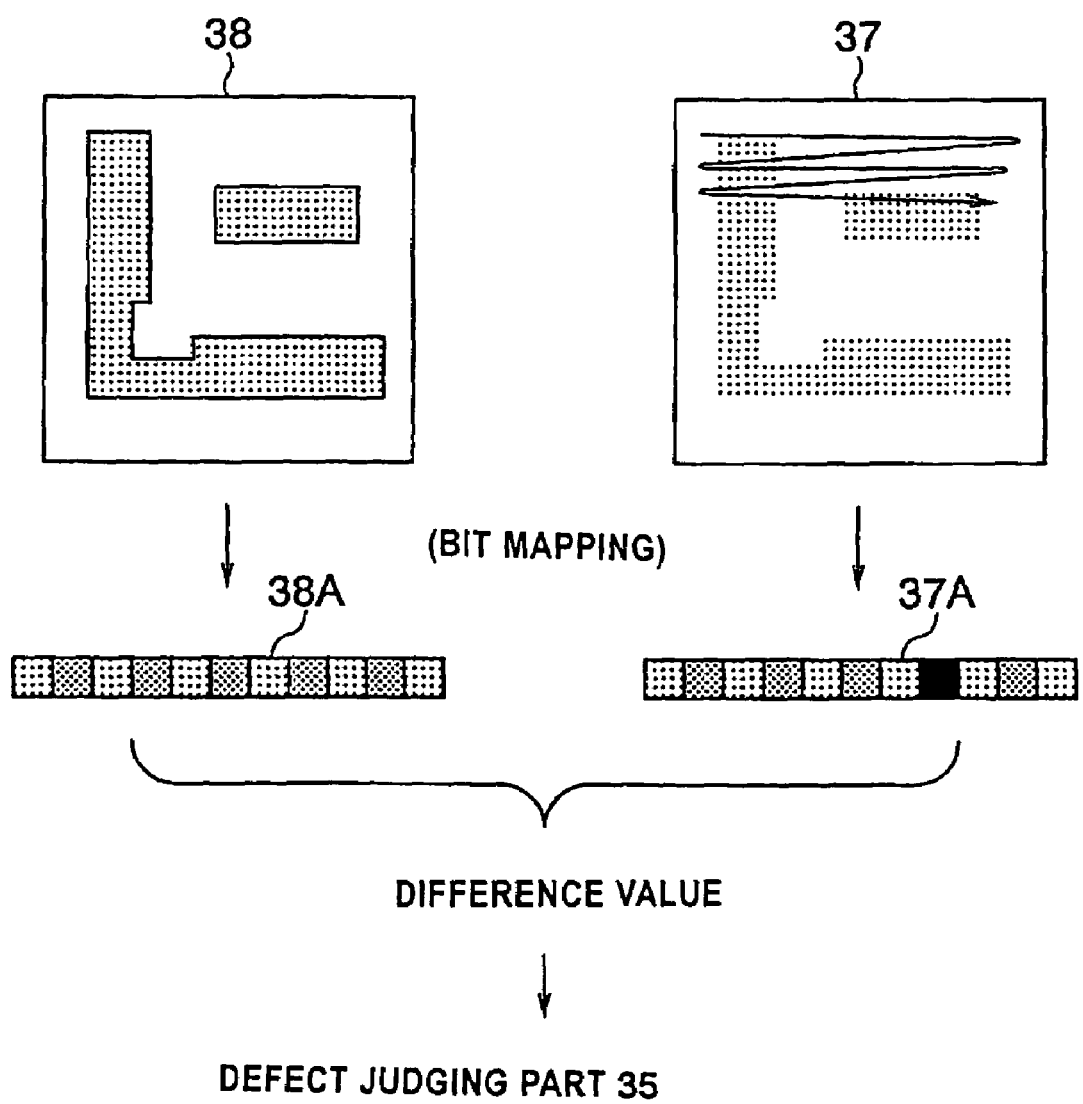
FIG. 13 is a view showing the method for inspecting the mask in the conventional mask inspection system.
Figure 14B:
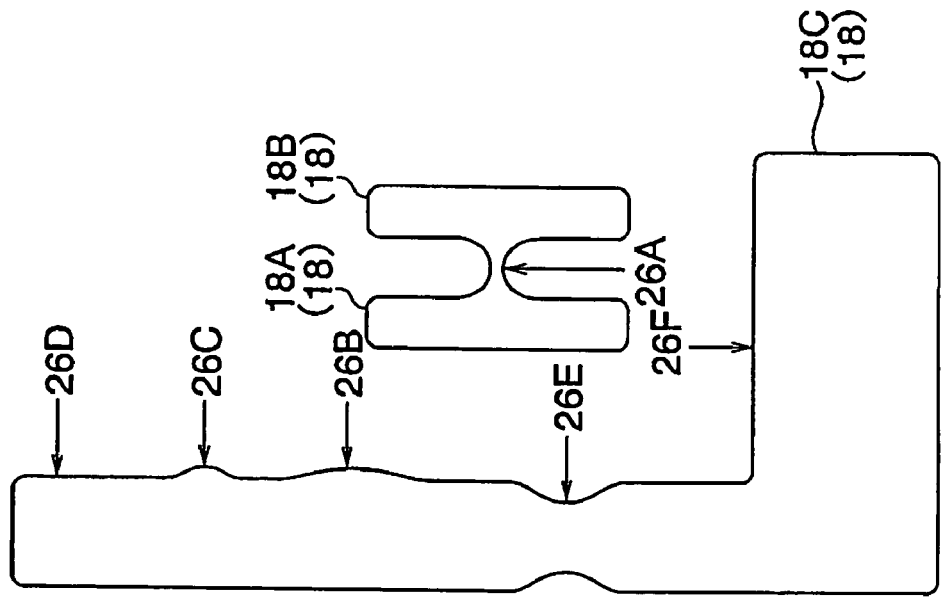
FIG. 14B is a plan view showing PR pattern on the body to be transferred such as wafer or the like to be transferred using the mask pattern of FIG. 14A.
Figure 14A:
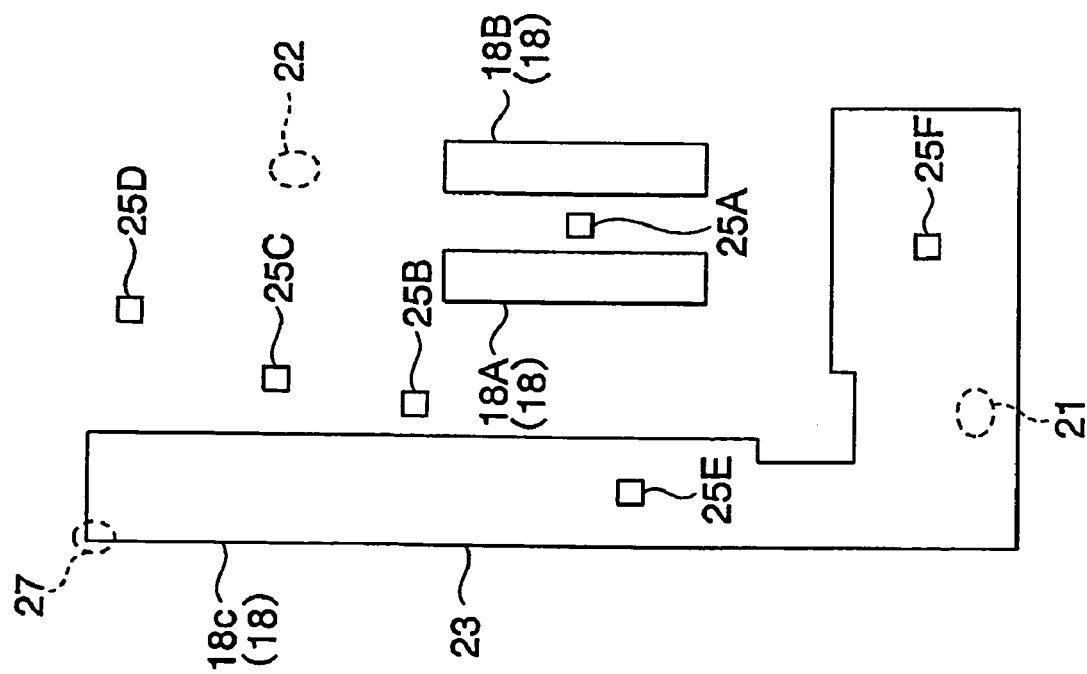
FIG. 14A is a plan view showing the mask pattern having the defect.

FIG. 9 is a flowchart showing a method for inspecting a mask according to a second embodiment example of the present invention. The method for inspecting the mask according to the present embodiment example, in the flow shown in FIG. 6, is the same as the method for inspecting the mask according to the first embodiment example except for the fact that there has Steps S11 to S15 in stead of Step S5 to S8.

In succession to Step S4, the defect setting part 12A prepares a layout data with defect in which the defect with predetermined size is set to the mask pattern of the layout data in such a way that the defect setting part 12A sets a size and a position of the defect to the mask pattern of the layout data (Step S11). Here, like the first embodiment example, the isolate defect such as square shaped defect or a pinhole or the like is set to a thick base or a space, while an edge defect composed of a concave part of square or a convex part of square is set to an edge. As to the size of the defect, first, the minimum size of 10 nm square is set, in every repetition of the below described Step S11 to S14, the size is successively made large. Further, defect setting is performed in such a way that the center of the defect corresponds to center coordinate of the pixel, and when enlarging the size of the defect, the same manner as above is adopted. It should be noted that the set defect is not limited to square, but it may be a rectangle or the like.

Next, the wafer simulating part 12B performs the wafer simulation to the mask pattern of the layout data with defect, and prepares the wafer simulation data with defect shown in FIG. 4B (Step S12). Although a plurality of defects are shown in FIG. 3C and FIG. 4B, in the present embodiment example, set defect is the defect on the position corresponding to one pixel of the mask pattern of FIG. 3C, per one flow of Step S4 to S9. Subsequently, the shape recognizing part 12C performs the feature extraction to the received wafer simulation data with defect, and detects the dimension in the vicinity of the defect setting position of the mask pattern of the wafer simulation data with defect (Step S13).

Next, the affecting level judging part 12D performs judgment of the affecting level (Step S8). The judgment of the affecting level is performed while aiming at an edge part comprised of an edge and a corner, and while aiming at an isolate part comprised of a thick base and a space. As to an edge part, in the case where the dimension of at least part of the mask pattern of the wafer simulation data with defect fluctuates not less than 7%, with the dimension of the mask pattern of the reference wafer simulation data as the reference; and the affecting level judging part 12D judges as being occurrence of the real defect, performs setting of the affecting level, and advances to Step S9.

FIGS. 10A to 10D show the mask patterns of the layout data in which the defect is set to line pattern, and FIGS. 11A to 11D show the mask patterns of the wafer simulation data with defect corresponding to FIGS. 10A to 10D respectively. In FIGS. 10A to 10D, the defect setting positions are identical each other, and the set defect size becomes large in the order of FIGS. 10A to 10D. For instance, in the mask pattern shown in FIGS. 11A, 11B, the dimension fluctuation rate is less than 7%, so that, in Step S8, judgment is made to be the pseudo defect, while in the mask pattern shown in FIGS. 11C, 11D, the dimension fluctuation rate is more than 7%, so that, in Step S8, judgment is made to be the real defect.

As for the isolate part, in the case where, to the isolate part of the mask pattern of the wafer simulation data with defect, its defect is transferred, judgment is occurrence of the real defect, performed setting is a setting of the affecting level, thereafter, advancing to Step S9. In the case where distance between the defect setting position and an edge of the mask pattern is relatively small, an edge defect is easy to take place, on the contrary, distance between the defect setting position and an edge of the mask pattern is relatively large, an isolate defect is easy to take place. Consequently, it is possible to appropriately judge the shift from the pseudo defect toward the real defect with the method for setting the affecting level that aims both of the isolate part and the edge part.

In Step S8, in the case where judgment is that, on both the edge part and the isolate part, the real defect does not occur, the step advances to Step S4. The smaller the defect size at the time the setting is performed, the larger the affecting level is made to set. It should be noted that, in the case where the pixel at the defect setting position is an edge or a corner, no judgment about the isolate part is required, because, generally, the defect does not occur in the isolate part.

In Step S4, the defect size is made larger in connection with its each side by 1 nm, to carry out Step S4 to S9 again. The detected affecting level, about typical graphic pattern, is stored in a database, and it is utilized in the inspection of the mask pattern having the same graphic pattern.

Next, the sensitivity setting part 12F sets an inspection sensitivity, that is, an inspection threshold value, on the basis of the affecting level judged in the affecting level judging part 12D and the inspection algorithm selected in the algorithm setting part 12E. In this case, the larger the affecting level, the smaller the inspection threshold value, that is, the higher the inspection sensitivity is made to set (Step S15).

According to the present embodiment example, on the occasion of the affecting level judgment, the defect size is made to enlarge by each 1 nm, it is possible to obtain the defect size, which shifts from the pseudo defect toward the real defect by each 1 nm units. Consequently, as compared with the first embodiment example, it is possible to accurately perform the defect inspection while setting the affecting level in high accuracy.

It should be noted that, in the above inspecting method, when the fluctuation rate of the dimension in the vicinity of the defect setting position is not less than 7%, judgment is occurrence of the real defect at an edge part, however the numerical value is only one example, so it is possible to adopt various values depending on quality of products or the like. That the judging method of the present embodiment example judges occurrence of the real defect in the case where the defect is transferred on the isolate part of the mask pattern of the wafer simulation data with defect is one example.

Further, width of numerical value is made 1 nm when enlarging the defect size, however, it is also possible to adopt various values depending on the inspection accuracy, such as, for instance, 10 nm or the like. As the judging method for judging occurrence of the real defect at an edge part, other than the judging method of the present embodiment example, it is also possible to judge that the standard mask pattern specifying permitted limit of the pattern shape is made to set previously, and judged is occurrence of the real defect when the edge part exceeds the standard mask pattern.

In the present embodiment example, when judging occurrence of the real defect at the edge part in Step S14 of FIG. 9, the dimension of the mask pattern of the reference wafer simulation data is taken to be the reference, however, dimension of a position having sufficiently large distance from the defect setting position of the mask pattern of the layout data or the mask pattern of the wafer simulation data with defect may be made reference.

As above, there is described the present invention based on the preferred embodiment example, needles to say, the method for inspecting the mask according to the present invention is not limited to constitution of the above described embodiment example; and methods for inspecting the mask to which various modifications and changes are applied from the above described embodiment example are also included within the scope of the present invention.

It is apparent that the present invention is not limited to the above embodiment, that modified and changed without departing from the scope and sprit of the invention.

What is claimed is:

1. A method for inspecting a mask for use in an inspection system, comprising:
    converting a first layout data without a defect pattern data into a first virtual photo resist pattern (PR pattern) data using a wafer simulating part as being a first step;
    converting a second layout data to which a defect pattern data is added by a defect setting part into a second virtual PR pattern data on a wafer using the wafer simulating part as being a second step;
    detecting a difference data between a first virtual PR pattern data and said second virtual PR pattern data using an affecting level judging part as being a third step;
    judging whether or not a defect of said defect pattern data is an allowable defect on the wafer based on said difference data using the affecting level judging part as being a fourth step; and
    extracting a defect, which is not the allowable defect on the wafer, as a real defect of said inspection object mask pattern, after eliminating the allowable defect on the wafer, as a pseudo defect, based on a judgment result at said fourth step, while verifying a real pattern data obtained from an inspection object mask pattern and said first layout data using a defect judging part being a fifth step.

2. The method for inspecting the mask for use in an inspection system according to claim 1, wherein said difference data is a difference data between said first virtual PR pattern data and the second virtual PR pattern data, in every pixel.

3. The method for inspecting the mask for use in an inspection system according to claim 2, wherein, in said second step, a size of a defect in said defect pattern data is fixed to a predetermined size.

4. The method for inspecting the mask for use in an inspection system according to claim 3, wherein, in said fifth step, the larger the pixel's difference data, the smaller the threshold value is made to set; and the real defect judgment is performed when the difference data between said real pattern data and said first layout data is larger than said threshold value.

5. The method for inspecting the mask for use in an inspection system according to claim 4, wherein said threshold value is set by the affecting level judging part into five stages in every pixel.

6. The method for inspecting the mask for use in an inspection system according to claim 2, wherein, in said second step, the size of the defect in said defect pattern data is made variable by the defect setting part, followed by obtaining the minimum size of the defect to be extracted as the real defect in said fifth step.

7. The method for inspecting the mask for use in an inspection system, according to claim 6, wherein, in said fourth step, when being judged as allowable defect on the wafer, process is returned to said second step, with enlarging the size of the defect in said defect pattern data, while when being judged as not allowable defect on the wafer by the affecting level judging part, and advances to said fifth step.

8. The method for inspecting the mask for use in an inspection system, according to claim 7, wherein in said fifth step, when being judged as not allowable defect on the wafer in said fourth step, a sensitivity setting part establishes a threshold value for judging the real defect that should be compared with the difference data between said real pattern data and said first layout data.

9. The method for inspecting the mask for use in an inspection system according to claim 2, wherein said fourth step comprises judging whether or not the defect is allowable on the wafer by a judgment algorithm corresponding to the pattern shape of said defect pattern data produced by an algorithm setting part.

10. The method for inspecting the mask for use in an inspection system according to claim 9 wherein said fourth step comprises judging whether or not the defect is allowable on the wafer a judgment algorithm corresponding to an edge, a corner, a thick base and a space produced by the algorithm setting part.

11. The method for inspecting the mask for use in an inspection system according to claim 10, wherein said ourth step comprises judging the defect residing in a thick base and a space by determining whether or not the difference data of a pixel in the position of the defect is substantially zero; and judging the defect residing in an edge and a corner by determining whether or not the difference data of the pixel in the position of the defect is a predetermined value which is larger than zero by the affecting level judging part.

12. The method for inspecting the mask for use in an inspection system according to claim 11, wherein said fourth step comprises judging the defect residing in the edge and the corner determining whether or not deviations of the pattern layout that the difference data are less than 7% by the affecting level judging part.

* * * * *